United States Patent

Wenzel et al.

[11] Patent Number: 6,150,724
[45] Date of Patent: Nov. 21, 2000

[54] MULTI-CHIP SEMICONDUCTOR DEVICE AND METHOD FOR MAKING THE DEVICE BY USING MULTIPLE FLIP CHIP INTERFACES

[75] Inventors: James F. Wenzel; Robert K. DeHaven; Bryan D. Marietta; James P. Johnston, all of Austin, Tex.

[73] Assignee: Motorola, Inc., Schaumburg, Ill.

[21] Appl. No.: 09/032,860

[22] Filed: Mar. 2, 1998

[51] Int. Cl.⁷ .......................... H01L 23/48; H01L 23/52; H01L 29/40
[52] U.S. Cl. .......................... 257/777; 257/778; 257/724
[58] Field of Search .................. 257/777, 778, 257/723, 724, 686

[56] References Cited

U.S. PATENT DOCUMENTS

| | | | |
|---|---|---|---|
| 5,072,364 | 12/1991 | Jardine et al. | 395/375 |
| 5,142,634 | 8/1992 | Fite et al. | 395/375 |
| 5,230,068 | 7/1993 | Van Dyke et al. | 395/375 |
| 5,287,467 | 2/1994 | Vlaner et al. | 395/375 |
| 5,303,356 | 4/1994 | Vassiliadis et al. | 395/375 |
| 5,394,529 | 2/1995 | Brown et al. | 395/375 |
| 5,428,786 | 6/1995 | Sites | 395/700 |
| 5,454,117 | 9/1995 | Puziol et al. | 395/800 |
| 5,469,551 | 11/1995 | Sites et al. | 395/375 |
| 5,508,556 | 4/1996 | Lin . | |
| 5,564,118 | 10/1996 | Steely, Jr. et al. | 395/375 |
| 5,592,634 | 1/1997 | Circello et al. | 395/586 |
| 5,623,614 | 4/1997 | Van Dyke et al. | 395/587 |
| 5,630,157 | 5/1997 | Dwyer, III | 395/800 |
| 5,732,278 | 3/1998 | Furber et al. | 395/800 |
| 5,760,478 | 6/1998 | Bozso et al. | 257/777 |
| 5,834,835 | 11/1998 | Mackawa . | |
| 5,856,937 | 1/1999 | Chu et al. | 365/51 |
| 5,903,908 | 5/1999 | Singh et al. | 711/122 |
| 5,939,782 | 8/1999 | Malladi . | |
| 5,977,640 | 11/1999 | Bertin et al. . | |
| 5,994,166 | 11/1999 | Akaram et al. . | |
| 6,031,284 | 2/2000 | Song . | |

Primary Examiner—Sheila V. Clark

[57] ABSTRACT

A bump-bonded multi-chip flip-chip device (100) is formed by manufacturing a mother chip (102) having a first set (207) of bumps (212) and a second set (209) of bump contacts (210). A daughter chip (104) is also formed which has conductive bumps (312). The daughter chip (104) and the mother chip (102) are placed face-to-face and contact is made between the daughter chips bumps (312) and the mother chips bump contact regions (210). After interconnection of the daughter chip (104) and the mother chip (102), the mother chip (102) is contacted to an IC package (106) using the bumps (212). The package (106) uses a plurality of metallic layers interconnected selectively by conductive vias in order to route signals between the mother chip (102), the daughter chip (104), and external terminals (112) of the package (106).

16 Claims, 12 Drawing Sheets

MULTI-CHIP SEMICONDUCTOR DEVICE AND METHOD FOR MAKING THE DEVICE BY USING MULTIPLE FLIP CHIP INTERFACES

FIELD OF THE INVENTION

The present invention relates generally to semiconductor manufacturing, and more particularly to, making a compact ball grid array (BGA) flip-chip semiconductor device containing multiple integrated circuits (ICs).

BACKGROUND OF THE INVENTION

Generally, the integrated circuit (IC) industry is continually attempting to improve the frequency of operation and performance of integrated circuits (ICs) while simultaneously attempting to add new functionality and features to these same integrated circuits (ICs). In order to improve performance while simultaneously increasing functionality, many different fabrication and packaging techniques are now being utilized or proposed for use in the IC industry. Some common prior art structures 10, 14, 16, and 18 which are believed to generally increase the performance of electrical systems and generally improve the functionality of integrated circuits are illustrated in FIGS. 1–4.

FIG. 1 illustrates one type of silicon-on-silicon (SOS) prior art device 10 which has been used or proposed for use in the IC industry. The SOS device 10 contains a large first integrated circuit 20 and a smaller second integrated circuit 22. The first integrated circuit 20 has two concentric peripheral rings of bond pads 24b and 24a with the pads 24b lying within the ring of pads 24a. The integrated circuit 22, which is an integrated circuit having a footprint much smaller than integrated circuit 20, has at least one ring of peripheral bond pads 26 around its periphery. The smaller integrated circuit 22 is placed on top of a central portion of the integrated circuit 20 as in FIG. 1. The bond pads 24b of integrated circuit 20 are then wire bonded to the bond pads 26 of integrated circuit 22 as illustrated in FIG. 1. The wire bonds coupled between the pads 24b and 26 allow for electrical circuitry on the integrated circuit 22 to communicate with electrical circuitry located on the integrated circuit 20. In addition, external terminals of an IC package, that are not illustrated specifically in FIG. 1, are wire bonded to the bond pads 24a of IC 20 in FIG. 1. Some bond pads 24b are selectively connected to some bond pads 24a to allow the IC 22 to connect to external package terminals. Therefore, the bond pads 24a in FIG. 1 allow both integrated circuits 20 and 22 to communicate with each other and communicate with an external environment that contains a larger electrical system.

The structure of FIG. 1 suffers from many disadvantages. First, electrical signals must be routed from active circuitry on a top active surface of the integrated circuit 22 to a peripheral portion of the integrated circuit 22 which contains the pads 26. Many IC dies can be the size of a postage stamp or the size of a human fingernail whereby this on-chip routing length on IC 22 alone is significant and performance-limiting. Once this on-chip routing is performed on a surface of IC 22, the wire bond from the bond pads 26 to the bond pads 24b is needed in order to connect electrical circuitry on the IC 22 to both the IC 20 and external package terminals. Therefore, these wire bonds will add another centimeter or so in wire length to the metallic routing of one or more IC signals in FIG. 1.

In addition to the above routing lengths, additional metallic routing must be performed between the bond pads 24b, active circuitry on the integrated circuit 20, active circuitry on IC 22, and bond pads 24a in FIG. 1. This additional routing serially adds more routing length to one or more already long routing paths previously discussed. Finally, yet another long wire bond connection is needed to connect integrated circuits 20 and 22 to the external terminals. These long routing interconnections in FIG. 1 will have increased resistance (R), increased inductance (I), and increased capacitance (C) than most other conventional IC connections. Due to these increased electrical characteristics between and around the ICs of FIG. 1, many high performance IC products (e.g., products having a desired operation at or above a few hundred mega Hertz (MHz) may not meet timing specifications and may be frequency limited.

In addition, noise and bandwidth problems occur along the longer routing paths that are required for some electrical signals in the structure of FIG. 1. The increased parasitics will require that input and output drivers/receivers on the integrated circuits 20 and/or 22 be increased in size and strength which will then increase integrated circuit sizes and complexity. Furthermore, the maximal number of inputs/outputs of the device of FIG. 1 is limited since inputs and outputs can only be connected from a periphery of the circuit 20 which is limited linearly in number by IC area. The longer connection paths of FIG. 1 will also not be able to supply proper power and dynamic current to the active circuitry of integrated circuits 20 and 22 whereby modern devices that consume on the order of tens of watts of power may not adequately be supplied with functional power and ground signals without adverse heating. In addition, the interconnection scheme utilized in FIG. 1 may limit architectural freedom, whereby system designers may not be able to optimally design system architectures in a manner to continue the current trend of doubling IC performance enhancement roughly every 1.5 years. In general, the increased parasitics associated with the long connection lengths ICs and terminals in FIG. 1 is unacceptable for many high performance systems. Shorter critical interconnect lengths need to be obtained in a new package design.

In an attempt to create a more compact device than that illustrated in FIG. 1, yet another silicon-on-silicon (SOS) device 12 was developed or proposed for use as illustrated in FIG. 2. In FIG. 2, three integrated circuits 30, 32, and 34 are stacked on top of one another with the active surface of each IC facing upward in FIG. 2. The integrated circuit 30 contains bond pads and tape automated bonding (TAB) portions 42 which electrically couple to active circuitry on the circuit 30. The integrated circuit 32 also contains conductive tab portions 40 in FIG. 2 which allows the IC active circuitry of circuit 32 to electrically interface to an external system or to other ICs 34 and 30. In a similar manner, integrated circuit 34 in FIG. 2 is electrically coupled to the conductive tab regions 38. All three integrated circuits 30, 32, 34 are then encapsulated by material 36 whereby the material 36 exposes the conductive tab portions 38, 40, 42 so that these tab portions may be three-dimensionally connected to conductive traces on planar printed circuit board (using a complex three dimensional wiring process or a complex and expensive special-purpose socket).

The package illustrated on FIG. 2 is an incredibly complex and expensive package to manufacture and design into a circuit board, and for this reason alone is prohibitive. In addition, even though a more compact semiconductor structure can be formed in FIG. 2 when compared to a solution that uses the configuration of FIG. 1, the package of FIG. 2 still suffers from many of the disadvantages discussed previously with respect to the SOS device of FIG. 1. In other words, the design of FIG. 2 still contains long routing paths between active circuitry and other integrated circuits within the packaged device where resistance, inductance, and capacitance are increased while frequency of operation and speed are typically decreased. The drivers for the active devices in FIG. 2 also need to be increased in size in order to handle the increased parasitics of these long interconnections. The same signal power and signal noise problems result as previously discussed, and the design of FIG. 2 is also pad-limited, as is the circuitry of FIG. 1, due to peripheral pad configurations. In general, while the design of FIG. 2 may enable placement of more functionality in a smaller spatial area than the structure of FIG. 1, the design of FIG. 2 still suffers from many of the disadvantages encountered by the design 10 in FIG. 1.

The integrated circuit (IC) industry has begun to use multi-chip modules (MCMs) in order to integrate more functionality into a single semiconductor package. One such example is one of the package configurations of the Pentium TM Pro product from Intel Corporation (Santa Clara, Calif. FIG. 3 illustrates a single multi-chip module (MCM) 16 which contains two integrated circuits 52 and 54 laterally adjacent one another in a semiconductor package 50. The integrated circuit 52 of FIG. 3 contains bond pads 56 and the integrated circuit 54 of FIG. 3 contains bond pads 58. These bond pads 56 and 58 connect to active devices on their respective ICs 52 and 54. These bond pads may either be used to couple active circuitry from one or more of the integrated circuits 52 and 54 to external pins of the package 50, or may be used to interconnect active circuitry from integrated circuit 52 to active circuitry on integrated circuit 54 via the package-contained metallic interconnect regions 60 in FIG. 3.

While the MCM module 16 allows more integrated circuits to be packaged in a single semiconductor package, the multi-chip module 16 of FIG. 3 still suffers from the parasitic and routing problems previously illustrated for FIGS. 1 and 2. In fact, the parasitics for the device in FIG. 3 are most likely worse than the parasitics for the devices in FIGS. 1–2. A further disadvantage is that the multi-chip module 16 of FIG. 3 is not a vertically stacked three-dimensional structure as are the devices of FIGS. 1–2. Due to this lacking feature, the two-dimensional footprint of the device 16 of FIG. 3 is greatly increased over the footprint of the devices illustrated in FIGS. 1 and 2. Therefore, when using the device of FIG. 3, the overall surface of system-level printed circuit boards which contain the device of FIG. 3 must be increased in surface size to accommodate the MCM components.

FIG. 4 illustrates another manner in which the integrated circuit (IC) industry is attempting to integrate more functionality into a smaller physical space. FIG. 4 illustrates a highly integrated chip (HIC) 18. In order to obtain more functionality in a smaller area, the integrated circuit industry is attempting to integrate many different types of structures, process steps, and functions onto a single large integrated circuit (IC) die. HIC devices may integrate many different types of IC modules into a mixed-technology device. FIG. 4 illustrates one theoretical possibility of a digital signal processor (DSP) core 62, a microprocessor 64, an analog to digital (A/D) converter 66, bipolar power logic 72, dynamic random access memory (DRAM) 68, and electrically erasable programmable read only memory (EEPROM) 70 all integrated onto a same contiguous integrated circuit substrate.

By integrating all of the two-dimensional circuit modules of FIG. 4 onto a single non-segmented two-dimensional substrate, the physical dimensions of the entire integrated circuit of FIG. 4 is very large. It is well known that larger integrated circuits are more likely to encompass some sort of silicon defect or be more likely to be affected by a process anomaly than smaller-sized ICs. Therefore, larger integrated circuits will typically yield at a much lower yield percentage than a composite of segmented and smaller integrated circuits. Therefore, the cost of manufacture of these HIC devices is very large, and the scrap percentage of the products illustrated in FIG. 4 is usually prohibitive. To avoid these problems, complex redundancy or complex error-correcting system architectures are needed which is also prohibitive.

Furthermore, the process technology required to manufacture, for example, a digital signal processor is very different from a process needed to manufacture, for example, a memory device (e.g., a DRAM or an EEPROM). Since all of these different technologies which usually require very different processes are now integrated on a single integrated circuit, compatibility issues between the different technologies and processes may render integration incredibly difficult, if not impossible. As an example, the device of FIG. 4 is probably too large, too complex, and too integrated to be manufactured even today using the most advanced and highly integrated process currently known. In addition, the structure of FIG. 4 still suffers from some of the parasitic problems discussed previously for FIGS. 1–3. For example, if the processor 64 requires some communication with the power logic 72, a large length of substrate surface area must be traversed by electrical signals before communications between these two diagonal and distant components can take place. The timing, power, routing, parasitics, etc. of these long connections is problematic both electrically and when designing the product using current computer aided design (CAD) tools. Therefore, the two-dimensional structure of FIG. 4 is limiting in a manner similar to that previously discussed for FIGS. 1–3 and even has added disadvantages as discussed hereinabove.

Therefore, a need exists in the industry for a new multi-chip device which can reduce the interconnect lengths of metal and reduce the adverse effects of routing parasitics. In addition, this new package should accomplish one or more of reducing driver size and or integrated circuit (IC) footprint area, improving power supply robustness to the MCM integrated circuits, reduce signal noise, improve product yields, result in simpler fabrication processes to enable enhanced yield, increase input and output signal counts of integrated products, enable more flexible system architectures and designs, reduce IC power consumption, enable lower power supply voltages, reduce conductive interconnect lengths, and/or reduce speed critical paths within integrated circuit (IC) architectures.

Figure 1:
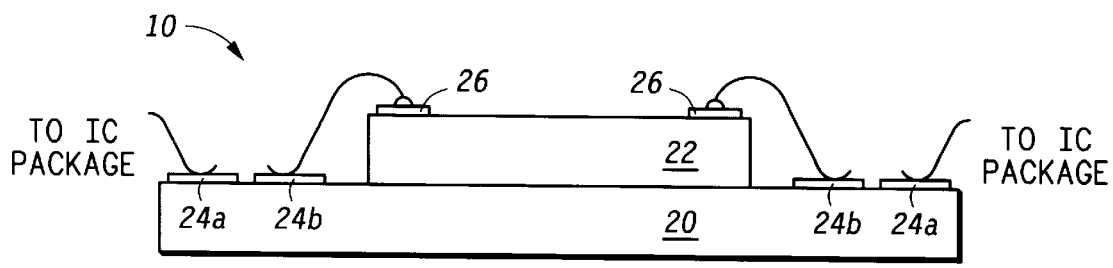
FIGS. 1 and 2 illustrate, in cross-sectional diagrams, prior art silicon-on-silicon (SOS) multi-chip modules.
Figure 2:
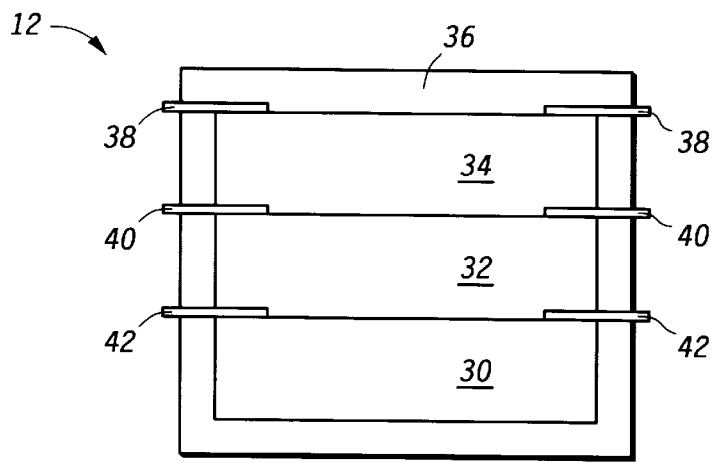
Figure 3:
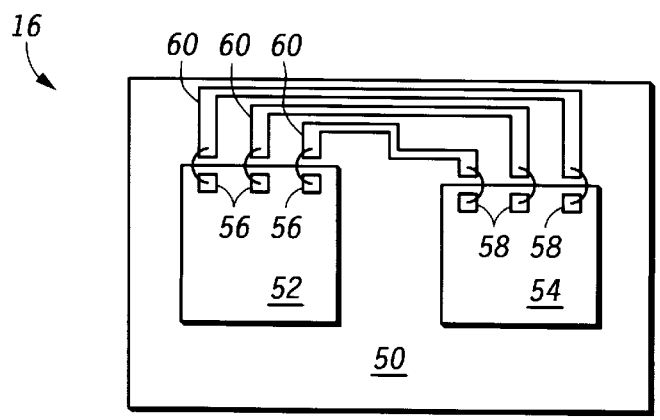
FIG. 3 illustrates, in a top perspective view, a planar multi-chip module (MCM) that is available in the prior art.
Figure 4:
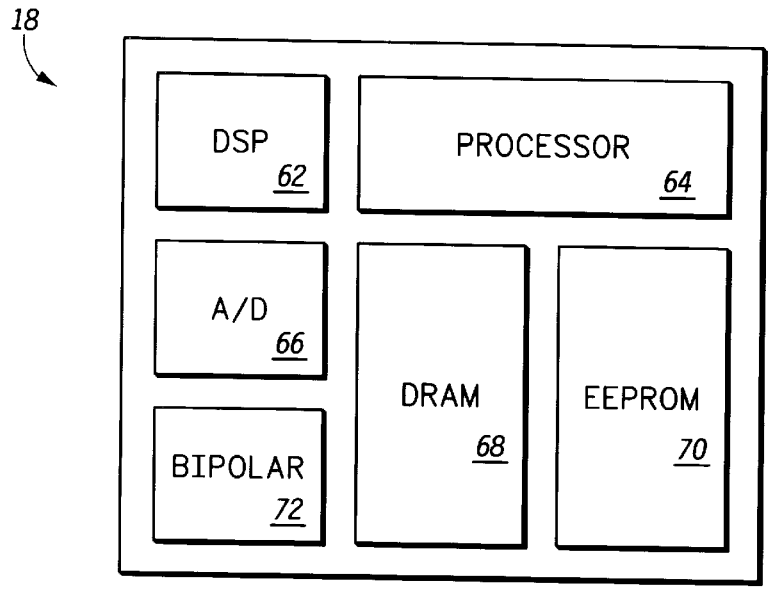
FIG. 4 illustrates, in a top perspective view, a highly integrated chip (HIC) that is available in the prior art.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention enables a method of manufacturing a bump-bonded multi-chip flip-chip semiconductor device which is generally improved in parasitics over prior art silicon on silicon (SOS), multi-chip module (MCM), and highly integrated chip (HIC) products of FIGS. 1–4 in many respects. In addition, the bump-bonded multi-chip flip-chip semiconductor device taught herein enables integrated circuit (IC) system architectures that were previously difficult to obtain in the art. When using the process taught herein, a mother integrated circuit (IC) is formed having a first set/array of bump connection locations which are connected to conductive bumps. This same mother integrated circuit is also formed having a second set/array of conductive bump contacts which are not initially coupled to any conductive bumps as are the first set/array of bump connection locations on the mother IC. This second set/array of conductive bump contacts on the mother IC is used to electrically couple the mother integrated circuit to a daughter integrated circuit (IC).

The daughter integrated circuit (IC), or a plurality of daughter chips, has a set of affixed conductive bumps in the same array pattern as the second set/array of conductive bump contacts on the mother IC. The bumps on the daughter are electrically and physically bonded to the second set of conductive bump contacts on the mother IC to make an IC sandwich device. Once these two integrated circuits (i.e., the mother and the daughter ICs) have been interconnected by a first ball bond interface to make the composite sandwich IC, the conductive bumps formed on the first set of bump connection locations on the mother integrated circuit are then used to make conductive bump contact to a single-layer-conductor or multi-layer-conductor IC package which contains external terminals which are, in a preferred form, package ball bumps.

This new multi-chip flip-chip technology enables formation of integrated circuit (IC) systems which have reduced interconnect parasitics. The reduced parasitics result due to more efficient three-dimensional placement of active circuitry and critical interconnects within the structure taught herein. These reduced parasitics ensure that integrated circuit driver sizes on all ICs in the structure taught herein can be reduced, while adequate power supply and reduced noise can also be achieved. Since the flip-chip ball grid array (BGA) device taught herein integrates together several segmented integrated circuits into a larger system, the several processes used to make the segmented ICs (which may be identical, similar, or radically different from one another) may be segmented into separated process flows and individually be simplified whereby improved product yields will result. Also, due to this segregation of circuit processing, smaller devices may be created whereby yield is improved further by avoiding silicon substrate defects and the like. Since the devices taught herein are not peripheral pad limited (i.e., in the device taught herein, connections to the mother and/or daughter IC can be made at any point of the IC active surface as opposed to only the periphery as in FIGS. 1–4). More I/O pins are available. The structure taught herein is more architecturally flexible whereby previously unavailable system architectures and system designs are now possible in the IC art. The three-dimensional structure taught herein will enable the design to reduce speed critical paths whereby the frequency of operation of the overall product can be improved. The devices taught herein may also be able to operate at lower voltages and will consume less power than the devices taught by the prior art due to reduced path length and reduced parasitics.

The invention can be further understood with reference to FIGS. 5–18 hereinbelow.

Figure 5:
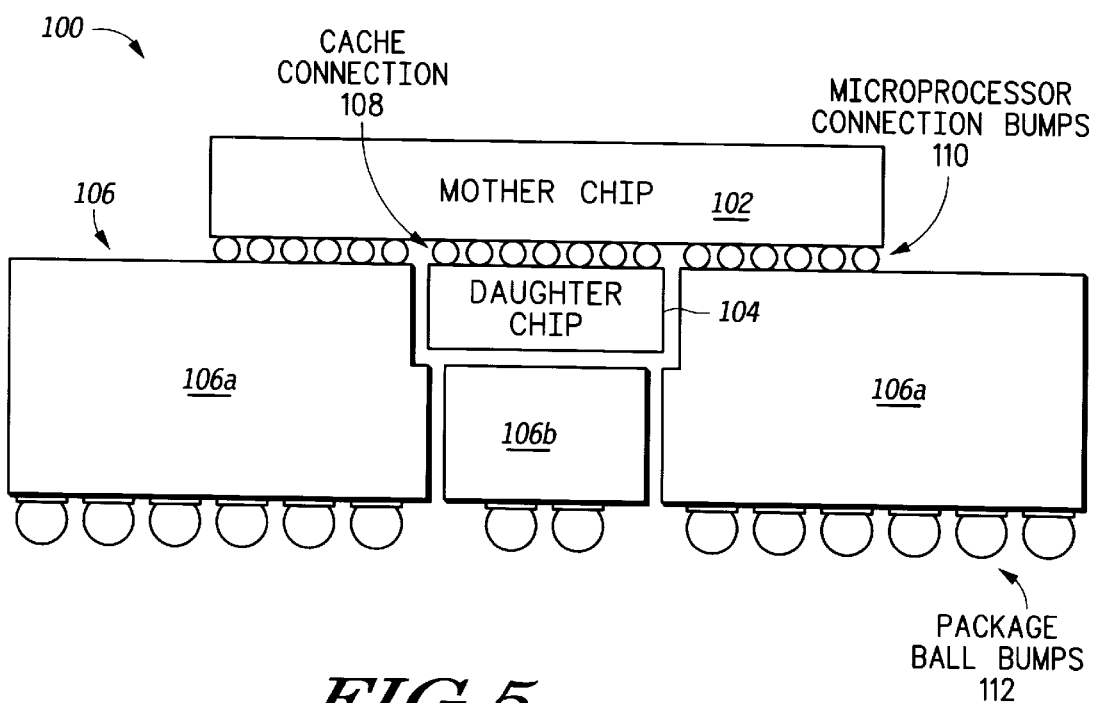
FIG. 5 illustrates, in a cross-sectional diagram, a bump-bonded multi-chip flip-chip semiconductor device made in accordance with the present invention.

FIG. 5 illustrates, in a cross-sectional diagram, one embodiment of a bump-bonded multi-IC flip-chip semiconductor device formed in accordance with the present invention. The device 100 of FIG. 5 has a mother integrated circuit or chip 102 and a daughter integrated circuit or chip 104. The active surface of the mother chip 102, which contains active circuitry, is downward-facing in FIG. 5, while the active surface/circuitry of the daughter integrated circuit 104 of FIG. 5 is upward-facing. In other words, the active surfaces of both ICs 102 and 104 are facing one another in FIG. 5. Therefore, conductive bumps 108 of FIG. 5 are used to interconnect active circuitry and interconnect structures located on the mother integrated circuit 102 with active circuitry or conductive structures located on the daughter integrated circuit 104. It is important to note that while FIG. 5 illustrates that a single daughter chip 104 is coupled to a single mother chip 102, it is possible to use the teachings herein to form alternate structures whereby a plurality of previously segmented daughter chips 104 are coupled via bumps 108 to different surface portions of the mother chip 102 in FIG. 5. The plurality of daughter chips 104 may contain all the same type of ICs (e.g., all the daughter chips may be the same 4 Mega Byte (MB) DRAM IC) or all the ICs 104 may be very different devices altogether (e.g., one may be a ferroelectric memory, another may be an analog filter, another may be a microcontroller, and yet another may be a III–V laser device, etc.).

Generally, the structure of FIG. 5 may be used to integrate any one integrated circuit device with one or more other integrated circuit device(s) either made by the same process or different processes. For example, one of either the chip 102 or chip 104 may be a digital signal processor (DSP), a microcontroller (MCU), a general purpose microprocessor or computer central processing unit (CPU), an analog-to-digital (A/D) converter, a digital-to-analog (D/A) converter, any memory device (such as a DRAM, an static random access memory (SRAM), an electrically programmable read only memory (EPROM), an EEPROM, a ferroelectric memory, a nonvolatile memory, a read only memory (ROM), ferromagnetic memory, optical storage, or the like), bipolar device, power metal on semiconductor field effect transistor (MOSFET) devices, radio frequency (RF) devices, infrared (IF) devices, analog or digital devices, sensors, discrete devices, micromachined devices, application specific integrated circuits (ASICs), telecommunications ICs, III–V devices, oscillators, liquid crystal display (LCD) displays, or any other device typically made in integrated circuit or electrical circuit form, while the other device 102 or 104 may be any one of the same. In a preferred form, one of the devices 102 or 104 will be some execution unit, such as a microprocessor CPU, while the other device of 102 or 104 will be some memory structure which functions as local memory for the CPU (e.g., a cache or embedded memory).

It is also important to note that one of the integrated circuits (ICs) 102 or 104 can be made by a different process or different materials than that used to form the other device 102 of 104. For example, either one or both of the integrated circuits 102 or 104 may be silicon devices, gallium arsenide devices, germanium devices, germanium silicon devices, silicon on insulator (SOI) substrate devices, silicon carbide devices, and/or the like in any combination. One device may have four levels of polysilicon and two levels of metal and the other device may have one level of polysilicon and six levels of metal.

The interconnected "sandwich" structure of the chips 102 and 104 is coupled to a ceramic, organic, or other package 106 through conductive connection bumps 110 in FIG. 5. In FIG. 5, central bumps 108 are used to connect two or more integrated circuits to each other while peripheral bumps 110 are used to connect the mother chip 102 to the semiconductor package 106 to enable electrical connection of the ICs 102 and 104 to an external environment.

The ceramic or organic package 106 is segmented into two portions 106*a* and 106*b*. Generally the material used to form the package 106 can be any one of a ceramic, an organic compound, a plastic mold compound, and/or the like. In one embodiment, both of the portions 106*a* and 106*b* of the package 106 in FIG. 5 are contiguous and made of one or more of ceramic, organic, or plastic material. This contiguous package 106 will contain at least one conductive interconnect layer for routing package ball bumps 112 to the connection bumps 110 through the package material. When the regions 106*a* and 106*b* are contiguous, no openings may exist through the package 106 to expose a backside of the daughter chip. Therefore, some small vias or openings may be formed into the package so that small heat sink holes can expose the backside of the daughter chip 104. These holes can be optionally injected with thermally-conductive material to improve thermal dissipation properties. These vias or holes are also useful to relieve thermally-enhanced stresses if air gaps are left between the ICs 102 and/or 104 and the package 106 after underfill processing. When the regions 106*a* and 106*b* are contiguous package material, regardless of whether or not heat sink holes are present or not, both the bottom surface of 106*a* and the bottom surface of 106*b* are able to support package ball bumps 112.

However, in another embodiment, the ceramic portion 106*b* may be removed from or never formed in the package 106. When in this form, the section 106*b* is a void, air region, cavity, or trench through the entire package 106. This void or air region will expose a backside of the daughter chip 104, thereby allowing improved heat sink capability for the daughter chip 104. In an alternate embodiment, the air void formed by the region 106*b* can be filled with a heat sink material, thermal grease, or a like heat sink structure or compound to further enable thermal dissipation improvements (many modem devices can consume 10–50 Watts of power and need a fan, heat sink, fluid flow, or like cooling mechanism). In the case where the region 106*b* is a heat sink region or an air region, only an annular region 106*a* is used for single metal or multi-level-metal interconnects between bump 110 and the package ball bumps 112. The package ball bumps 112 of FIG. 5 are used to connect the semiconductor structure, which contains the chips 102 and 104, to a printed circuit board (PCB) or like electrical media.

Typically, the bumps 108 and bumps 110 of FIG. 5 are formed from lead/tin conductive material which may optionally be doped with copper. In another alternative, conductive gold-based materials may be used for the bumps 108 and 110. Conductive epoxies may also be used to form conductive bumps in the industry. However, metallic composites of various metallic materials are typically used in bump processing in the industry. Typically, the bump diameter of bumps 108 and 110 is within the range of 1 mil to 5 mil as deposited, but may progress to dimensions less than this range as bump technology improves. In addition, the package ball bumps 112 of FIG. 5 are made from lead/tin, lead/tin with copper, gold, or some composites of metallic materials, and these ball bumps are formed to a diameter of 0.6 millimeter (mm) or less as deposited.

Figure 6:
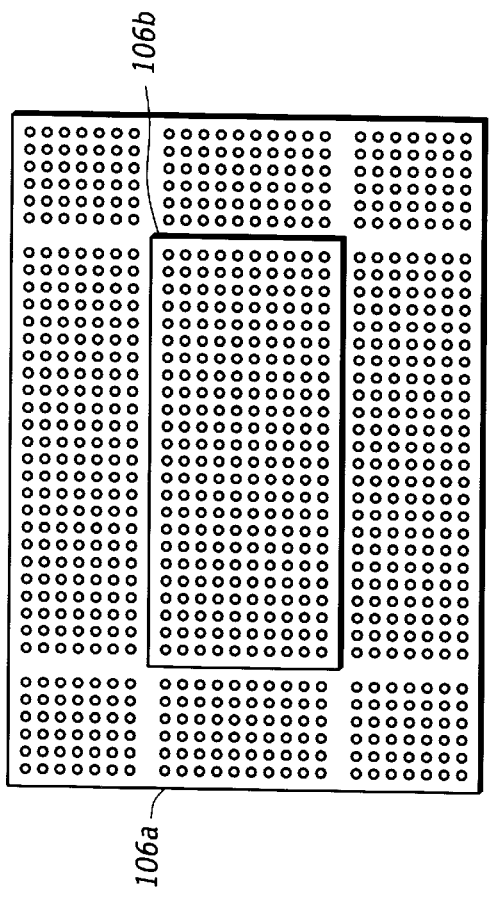
FIG. 6 illustrates, in a bottom perspective view, one embodiment of a ball grid array (BGA) ceramic package previously shown in FIG. 5 in accordance with the present invention.

FIG. 6 illustrates the package 106 of FIG. 5 as viewed from a bottom perspective of FIG. 5. FIG. 6 clearly illustrates the annular peripheral section of the package 106 which is referred to as section 106*a* in FIG. 5. FIG. 6 also illustrates the central portion of the package 106*a* which is referred to as an optional package portion 106*b* in FIG. 5. FIG. 6 illustrates one of the possible package embodiments where the portion 106*b* contains ball bumps contacted below a ceramic, plastic, or organic package material. However, as previously discussed, this central section 106*b* of FIG. 6 may be an air gap region which exposes a backside of the daughter chip 104 or may be an air gap region which is filled with a heat sink material in another embodiment. In these later forms, the region 106*a* is either absent or is not used to support metallic routing and ball bonds 112.

Figure 7:
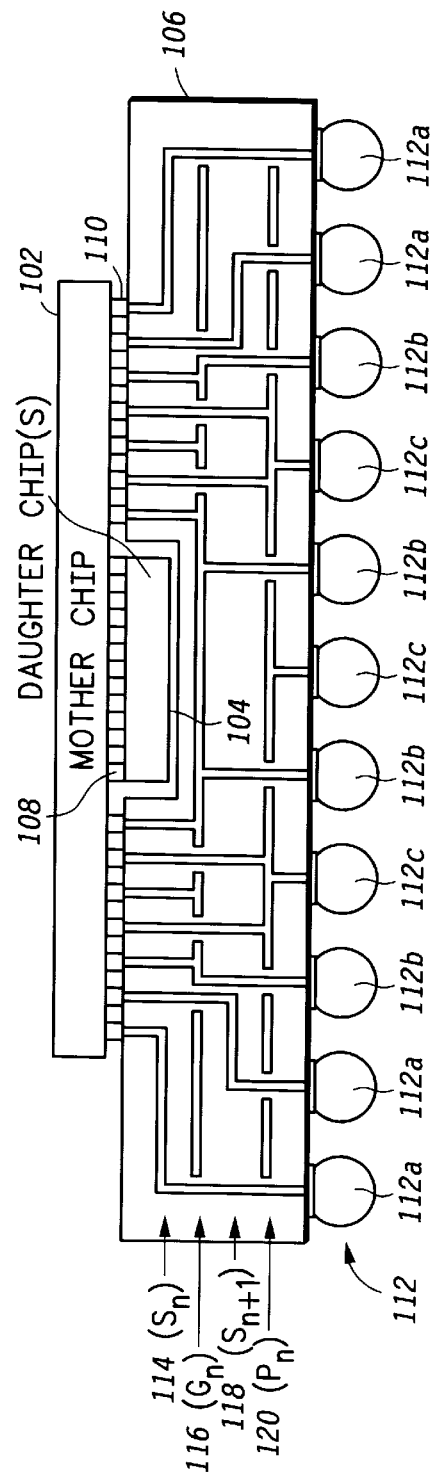
FIG. 7 illustrates, in a magnified cross-sectional view, one embodiment of an interconnection scheme which can be used to connect package ball bumps in FIG. 5 to the mother IC in FIG. 5 in accordance with the present invention.

FIG. 7 illustrates a magnified portion of FIG. 5 where FIG. 7 is used to specifically illustrate the metallic interconnection system which exists between the mother chip 102 and the package ball bumps 112 located on a bottom portion of the package 106. FIG. 7 clearly illustrates the mother chip 102, which is coupled to the daughter chip 104 via the bumps 108. FIG. 7 also illustrates that the mother chip 102 is coupled to a top surface of the package 106 via the peripheral conductive bumps 110. The bumps 110 and 108 may be bumps formed from the same process and/or same materials, or the bumps 110 and 108 may be bumps formed by completely different materials and/or very different processes. FIG. 7 illustrates that one or more layers of metal, which are segmented into interconnect regions and vertically interconnected by selectively-placed conductive vias, are used to route one or more of the conductive bumps 110 to one or more conductive ball bumps 112 through package 106.

Specifically, FIG. 7 illustrates that four or more conductive layers are used to route all different types of electrical signals from the bumps 110 to the ball bonds 112. It is important to note that the package 106 of FIG. 7 may contain one conductive layer or up to tens of stacked and interconnected conductive layers for routing purposes depending upon the complexity of interconnection needed to the specific device being manufactured. FIG. 7 illustrates one or more upper signal metallic layers 114, which are abbreviated as layers $S_N$. N is a finite positive integer. These layer(s) 114 route electrical signals, such as logic signals, or active analog signals, between the external world coupled to bumps 112 and the mother chip 102. Below this layer 114 is one or more ground (GND) metallic layers 116 which are graphically labeled $G_N$. N being yet another integer that is greater than zero. The GND layers as used to route ground signals to the chips 102 and 104 in FIG. 7. Below these layers 116 are more signal layers similar to the layers 114. This second set of signal layers are labeled as signal layers 118. These signal layers 118 are labeled in FIG. 7 as $S_{N+1}$. Finally, a bottom one or more layers 120 are used to route one or more power voltage supply levels for one or more voltage supplies that are needed by the chips 102 and/or 104. This at least one layer of metallic material for routing Vdd, Vpp, etc., is labeled as $P_N$. Generally, each conductive layer within the package of 106 of FIG. 7 performs a specific routing function of either routing digital/analog electrical signals, routing ground (GND) voltages, or routing power supply voltages such as logic Vdd (e.g., 1.8 volts, 2.5 volts, 3.3 volts, 5.0 volts, etc.), EPROM program voltages Vpp, etc.. In addition, the ground and power layers of FIG. 7 may be formed as conductive planes.

Due to the typical segmenting of functionality of the various metallic layers within the package 106, various ball bumps 112 serve specific functions within the package structure of FIG. 7. The balls 112a in FIG. 7 are used to route digital or analog electrical signals between the external environment and the mother chip 102 (e.g., data lines, address lines, control signals, A/D inputs, status lines, etc.). Ball bumps 112b in FIG. 7 are used to supply ground (GND) potentials to the mother chip 102 and the daughter chip 104. The conductive ball bumps 112c of FIG. 7 are used to route one or more power supply voltage levels to the chips 102 and 104. As illustrated in FIG. 7 various patterns and lithographic openings are formed within the metal layers within the package 106 in order to effectively route the various signals illustrated in FIG. 7 through the package material 106 to their proper destination. Therefore, the package 106 is internally similar in electrical routing to a multi-metal layered printed circuit board.

Figure 8:
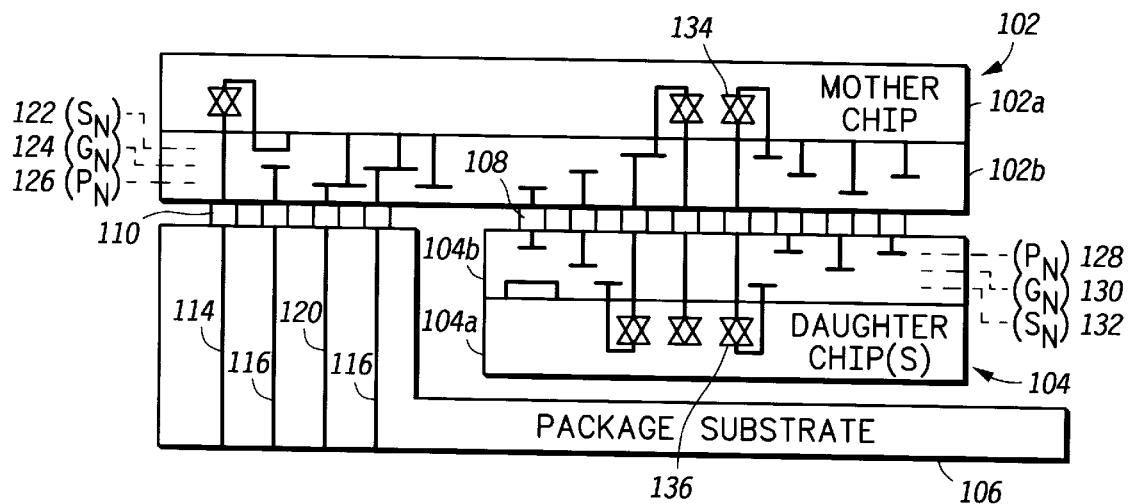
FIG. 8 illustrates, in a magnified cross-section diagram, a interconnect structure used to interconnect the mother chip of FIG. 5 with the daughter chip in FIG. 5 in accordance with the present invention.

FIG. 8 illustrates the conductive interconnections that are formed between the daughter chip 104 and the mother chip 102 in FIG. 5 in a magnified perspective. FIG. 8 specifically illustrates the mother chip 102 having a semiconductor substrate portion 102a. The portion 102a is primarily made of semiconductive material and used to form or support active and passive electrical devices. The overlying conductive interconnect and passivation portion 102b in FIG. 8 contains inter-level dielectric (ILD) materials such as tetraethylorthosilicate (TEOS) glass, borophosphosilicate glass (BPSG), spin on glasses (SOGs), silicon nitride, low permitivity (k) materials, composites thereof, etc.) that separate and surround various metallic or semiconductive interconnects and vias. These vias and interconnects are formed comprising of one or more of polysilicon, amorphous silicon, tungsten, aluminum, copper, titanium, silicides, titanium nitride, the like, and composites thereof.

FIG. 8 also illustrates the daughter chip 104 which has a semiconductive substrate portion 104a, which supports electrical devices, and an upper metallic routing and passivation portion 104b. FIG. 8 illustrates that the mother chip 102 and the daughter chip 104 are coupled together using the metal interconnects within portions 102b and 104b along with the conductive bumps 108 which were first shown in FIG. 5. FIG. 8 also illustrates the interconnection between active devices and metallic regions of the mother chip 102 with the package substrate 106 through use of a second set of bumps 110 (see also FIG. 7). In current integrated circuit designs, anywhere from one to seven layers of conductive interconnect material can be utilized for any one integrated circuit (either IC 102 or 104 in FIG. 8). Therefore, portions 102b and 104b of FIG. 8 clearly illustrate that either one or a plurality of metallic and/or semiconductive layers may be formed on each integrated circuit 102 and 104 to perform proper signal routing between various electrical devices and conductive structures.

FIG. 8 illustrates driver/receiver circuits 134 and 136 which are resident within active areas of the integrated circuits 102 and 104 and enable communication between active circuitry on the circuits 102 and 104 through the bumps 108. As can be seen from FIG. 8, vertical connections can be made directly between the top surface of the active area 102a and a top surface of active area 104a whereby connection between the two integrated circuits 102 and 104a may be made with reduced parasitics and reduced physical length unlike the prior art. These reduced parasitics will provide the advantages previously discussed herein in various introductory paragraphs.

Figure 9:
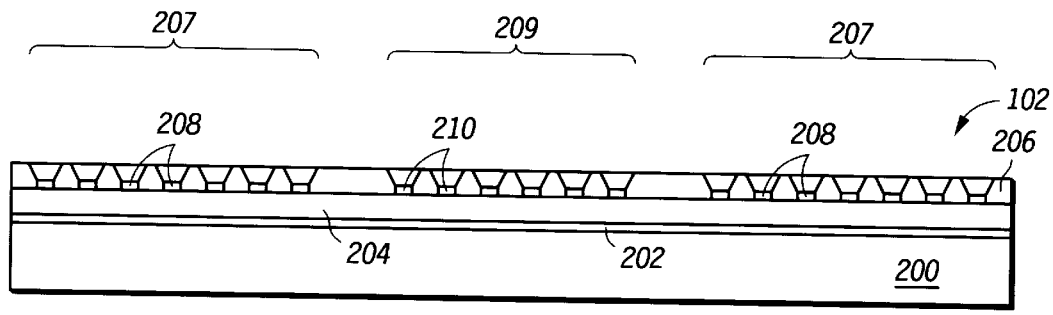
FIGS. 9–17 illustrate, in cross-sectional diagrams, a series of successive process comprising a method for fabricating the device of FIGS. 5–8 in accordance with the present invention.
Figure 10:
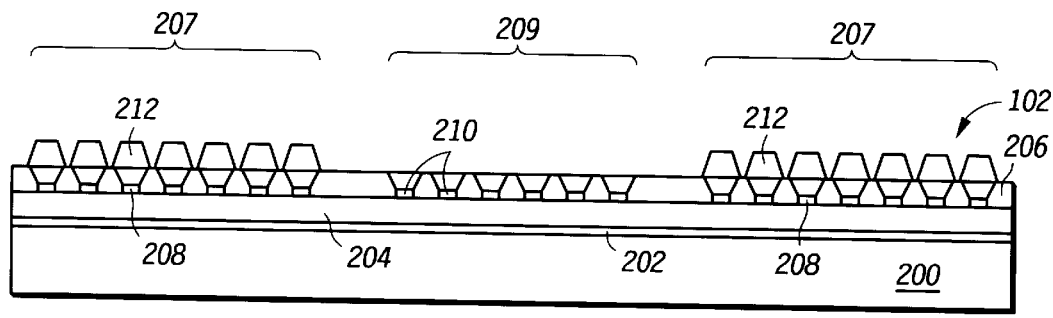
Figure 11:
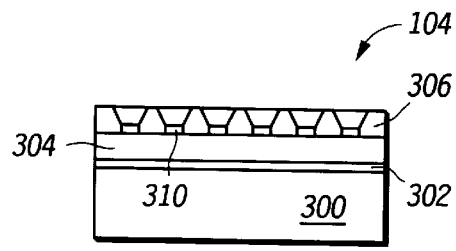
Figure 12:
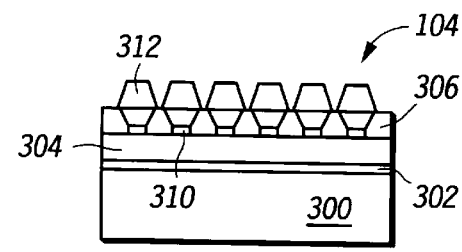
Figure 13:
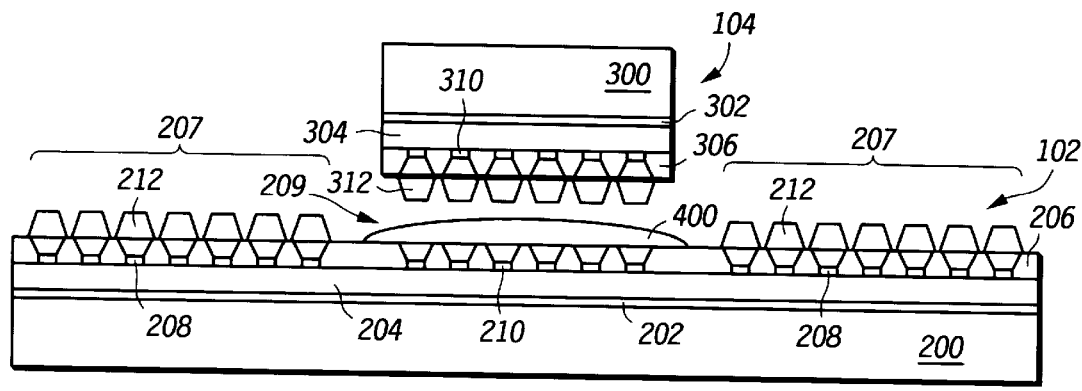
Figure 14:
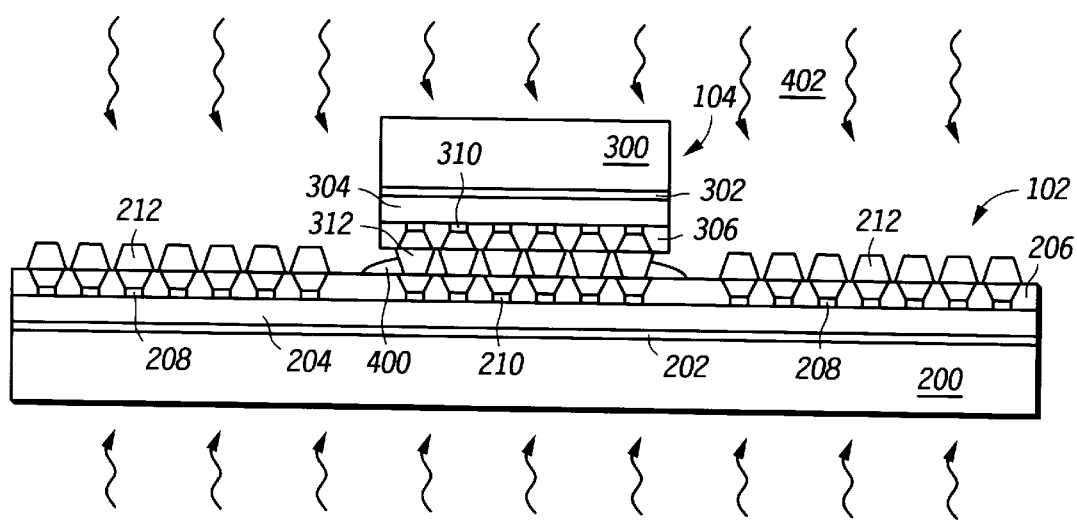
Figure 15:
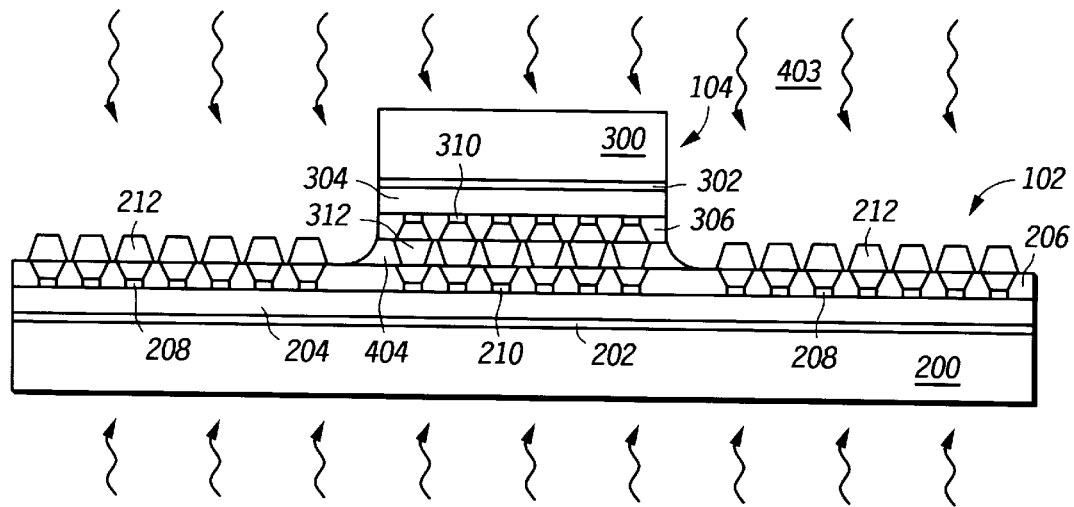
Figure 16:
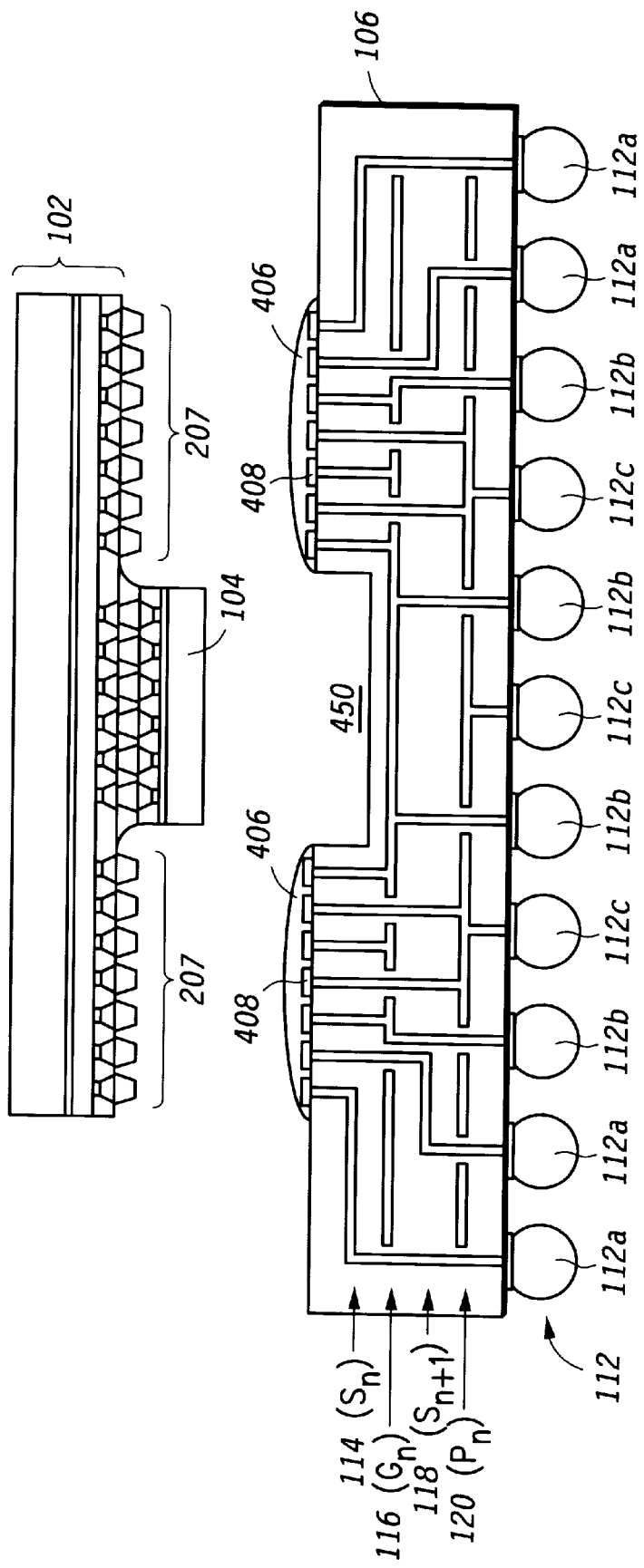
Figure 17:
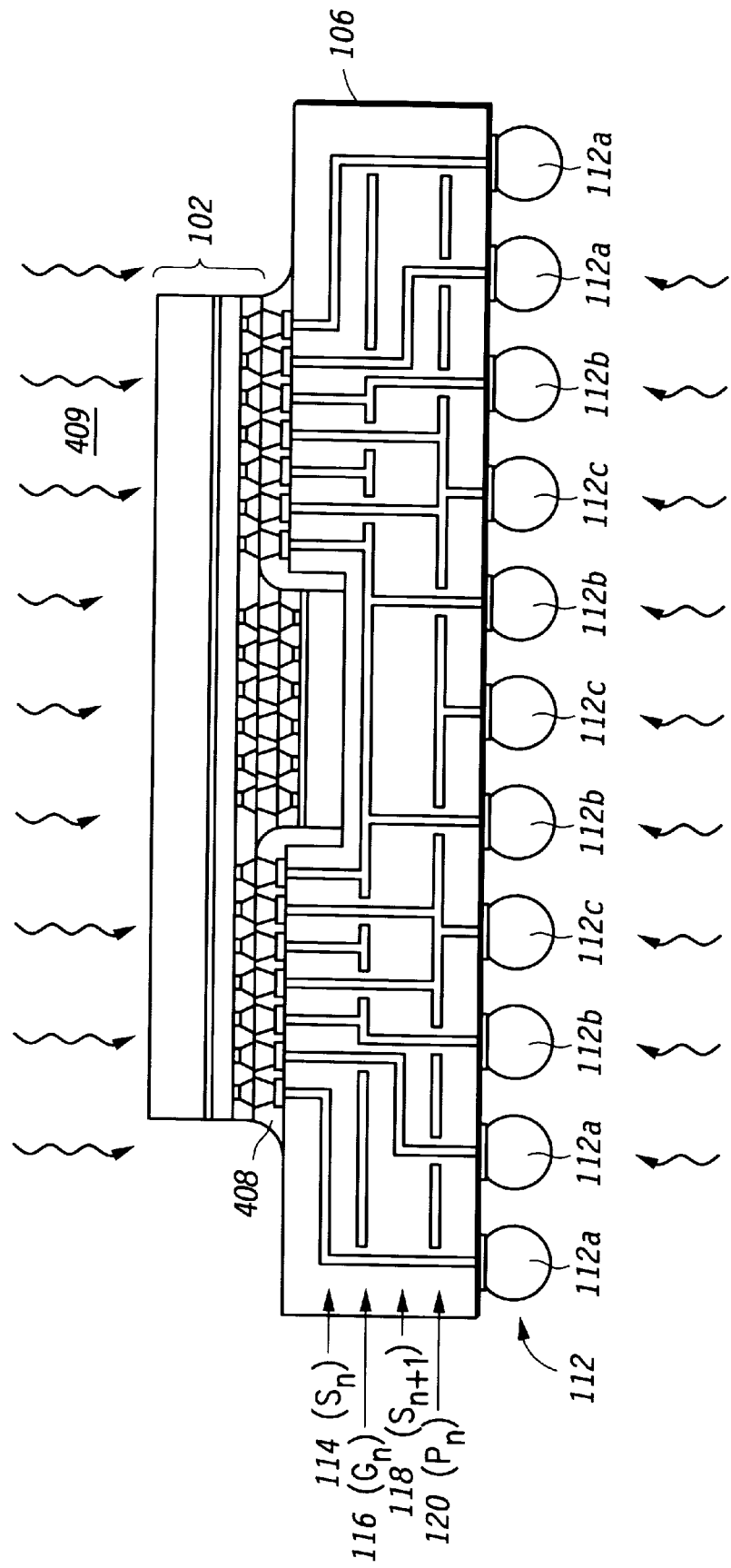

FIGS. 9–17 generally illustrate the process used to form the structure illustrated in FIG. 5. FIGS. 9 and 10 illustrate the final formation steps of the mother chip 102 while FIGS. 11 and 12 illustrate the final formation steps of the daughter chip 104. FIGS. 13–15 illustrate how the daughter chip is coupled to the mother chip 102 while FIGS. 16 and 17 illustrate how the package 106 is coupled to the now composite sandwich structure of the mother chip 102 and the daughter chip 104 from FIG. 15.

FIGS. 9 and 10 illustrate the formation of the mother chip 102. In FIG. 9, the mother chip 102 begins as a semiconductor wafer where a single die site 200 of the semiconductor wafer is illustrated in FIG. 9. Active circuitry 202 is formed over a top active surface of the substrate 200. The circuitry 200 of FIG. 9 is analogous to the layer 102a of FIG. 8. The active circuitry 202 is interconnected by interleaving layers of dielectric material and conductive interconnect layers wherein the conductive interconnects are selectively connected together by conductive vias in a die region 204 of FIG. 9. The region 204 of FIG. 9 is analogous to the region 102b of FIG. 8. A top metallic layer within the portion 204 is exposed to form bump bonding regions 208 and 210 as labeled in FIG. 9. The bump bonding regions 208 and 210 are grouped into two different sets of bump connection regions 207 and 209. The region 207 in FIG. 9 is a peripherally-located set of bump bonding regions 208. The region 209 in FIG. 9 is a centrally-located bump bonding region 210. Final passivation material, which helps to protect and align bump contacts, is shown as layer 206 in FIG. 9.

FIG. 10 illustrates that connective bumps 212 are formed overlying the bump connection regions 208 located within the first set 207 of conductive bumps. In FIG. 10, the second set 209 of conductive bumps 210 is masked from this bump process so that no conductive bumps are formed on the contact regions 210 at this point in time.

FIGS. 11–12 illustrate the formation of the daughter chip 104 which was first illustrated in FIG. 5. FIG. 11 illustrates that the daughter integrated circuit (IC) 104 is formed on a semiconductor wafer 300 where a portion of the semiconductor wafer 300 is illustrated in FIG. 11. Active circuitry 302 is formed on top of the substrate 300 and dielectric and conductive material 304 is formed over active circuitry 302 in order to selectively interconnect active circuitry 302 and provide connections between active circuitry 302 and an external environment. The region 302 of FIG. 11 is somewhat analogous to the region 104a of FIG. 8, and the region 304 of FIG. 11 is somewhat analogous to the region 104b of FIG. 8. A top conductive layer of the daughter chip 104 (typically copper, aluminum, or an alloy thereof) contains a passivation layer 306 which is one or more of polyimide, phososilicate glass (PSG), or silicon oxynitride. Conductive regions and openings are selectively formed adjacent this layer 306 to form bump connection regions 310 as shown in FIG. 11.

FIG. 12 illustrates that conductive bumps are formed over a top of the bump contact regions 310 in FIG. 11. The bumps, as taught herein in FIGS. 9–12, may be formed by an evaporation technique which is performed through a masking layer placed on top of one of either the mother circuit 102 or the daughter circuit 104. Alternatively electroplating or electroless plating may be used to form conductive bumps in FIGS. 9–12. Also, ball bonding can be used to form a bump on a bump contact wherein a wire which usually connects to the ball bond is broken by mechanical means after bump placement. Also, conductive balls and/or conductive epoxy can be physically and individually placed onto the bump contact regions of the integrated circuit (IC).

Both the mother integrated circuit 102 and the daughter integrated circuit 104 may be completely formed by different processes, to different specifications, and possibly by different companies or manufacturing locations. These mother and daughter wafers are diced to form segmented mother and daughter ICs that are provided for multi-chip flip-chip assembly.

FIGS. 13–15 illustrate how a daughter chip 104 and a mother chip 102 are interconnected to one another to form a multi-chip flip-chip sandwich. FIG. 13 illustrates that the mother integrated circuit 102 and the daughter integrated circuit 104 are placed with the active surfaces of each IC facing one another. In FIG. 13, the second set 209 of bump connections 210 on the mother chip 102 are covered with site preparation materials 400. The material 400 in FIG. 13 is optional, and is preferably a reducing agent, such as any flux which is commonly used for solder operations. In another form, the material 400 may also include a dielectric underfill material with or without the flux compound, where the dielectric underfill material is any underfill material commonly used in the packaging of integrated circuits (ICs) and does not interfere with the electrical contacting.

FIG. 14 illustrates that the daughter chip's conductive bumps 312 are brought into contact with the bump connection regions 210 on the mother chip 102 after the depositing of the optional material 400. A thermal heat cycle 402 is utilized in order to bond the bumps 312 to the connection regions 210. It is important to note that connection between the daughter chip 104 and the mother chip 102 should preferably be performed in a manner which does not adversely affect the peripheral ball bonds 208 around a periphery of the mother chip 102. This type of selective bonding of the daughter chip 104 and the mother chip 102 without damaging the peripheral ball bonds 208 can be accomplished in one of many manners.

In a first manner, the bumps 312 are made of material which has a melting point lower than a melting point of the mother chip peripheral bumps 212. In order to achieve this difference in melting point, the bumps 312 may be formed of a eutectic conductive material such as lead/tin, while the bumps 212 may be formed by a non-eutectic combination of lead and tin. In this embodiment, the environment is typically a thermal environment heated to somewhere between 180 degrees Celsius to 230 degrees Celsius. At this process temperature and for this material embodiment, the daughter bumps 312 will melt and render good electrical contact with the mother chip contact regions 210 while the other bumps 212 in FIG. 14 will not be adversely affected by the thermal process. The material for bumps 212 can be selected so that furnace temperatures of roughly 250 degrees Celsius or greater are needed in order to melt the bumps 212. For example, C4 bumps may be utilized as the bumps 212 in FIG. 14 where C4 bumps flow at much higher temperature than 250 degrees Celsius in order to form permanent electrical contact to another conductive member.

In another form, thermal-sonic bump connection technology can be used to make connection between the bumps 312 and the regions 210 of FIG. 14 without adversely affecting the structure or mechanical construct of the bumps 212 in set 207. With thermal-sonic technology, the bumps 312 and the bumps 212 may be formed from similar or identical processes and materials, and thermal temperature can be reduced since the reduction in thermal energy is supplemented by sonic energy provided to any touching bond pad and bump between the daughter chip 104 and the mother chip 102. Since the sonic energy is only experienced by the bumps interconnecting the daughter chip 104 to the mother chip 102, the bumps 212, which do not experience the sonic energy due to a lack of contact with any other conductive member are physically unaffected.

FIG. 15 illustrates that an underfill process is used to provide an underfill material 404 between the mother chip 102 and the daughter chip 104 after bump connection processing. The underfill material 404 is cured within the structure of FIG. 15 via a thermal environment 403 in FIG. 15. A typical range for the thermal environment 403 lies within roughly 125 degrees Celsius and 150 degrees Celsius. At the end of FIG. 15, the daughter chip 104 and mother chip 102 have been effectively electrically interconnected to enable subsequent contact to an IC package with material 404 providing thermal dissipation, mechanical strength, and electrical isolation to the adjacent conductive materials. It is important to note that the material 404 should be able to maintain functional electrical contact between the ICs 102 and 104 in FIG. 15 even if a subsequent process temperature of the whole device would exceed the melting point of the bumps 312. This property ensures that thermal bonding of bumps 212 does not adversely affect the reliability of previously-bonded bumps 312.

FIGS. 16–17 illustrate the method for connecting the composite sandwich structure of the mother chip 102 and the daughter chip 104 to a package 106. In FIG. 16, optional site preparation material 406 is deposited over the contact regions 408 on the package 106. Once the optional material 406 is in place, the package 106 and he structure containing ICs 102 and 104 are brought into contact with each other with the IC 104 fitting into a trench 450 that is located within the package 106. When brought into contact, metallic contact regions 408 on the package electrically contact to the first set 207 of bumps 212 formed on the mother chip 102. FIG. 17 illustrates that at this point in time, a thermal process 409 is used to melt the bumps 212 and form electrical interconnection between the package 106 and the mother chip 102. While the thermal cycle or process 409 needed to melt these bumps 212 is greater than the thermal cycle needed to melt the bumps 312 in one embodiment, the underfill material 404 in FIG. 15 will hold the daughter chip and mother chip together without adverse effects. The mechanical fit between the daughter IC 104 and the trench 450 should accommodate all tolerances to prevent any adverse affects to the previously-made electrical contacts between the IC 104 and the IC 102. In addition, any thermal-sonic process will bond the bumps 212 while not adversely affecting the previous bonds made between the daughter chip 104 and the mother chip 102 as previously discussed. After this thermal cycle 409 of FIG. 17, a second underfill process is used to form underfill material 408 at least between the mother chip 102 and part of the package 106, and most likely between the daughter chip 104 and the package 106 as well. It is possible that some underfill air gaps can remain between the two interconnected structures of FIG. 17 without adverse effects, especially when using package holes/vias as taught with respect to FIG. 5.

At the end of FIGS. 11–17, a completed flip-chip multi-chip device is completed. The ball bumps 112 may be used to connect the device into a printed circuit board or a like larger electrical system.

Figure 18:
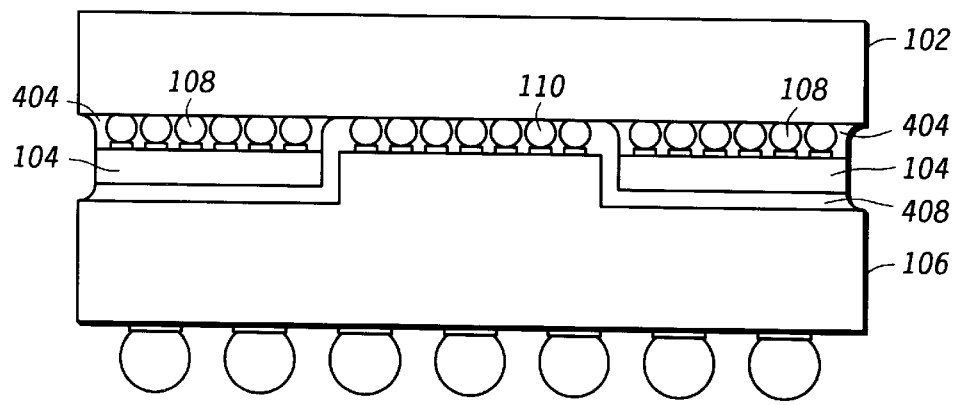
FIG. 18, illustrates, in a cross-sectional diagram, an alternate method for spatially configuring the flip-chip device illustrated in FIG. 5 in accordance with the present invention.

FIG. 18 illustrates an alternate embodiment to that illustrated in FIG. 5. FIG. 5 illustrates that a cavity or trench is formed in a central portion of the package 106 whereby peripheral portions of a mother chip 102 are used to contact to a package and central portions of a mother chip are used to contact one or more daughter chips. FIG. 18 illustrates that this contact methodology of FIG. 5 may be reversed to enable slightly different IC sandwich configurations. In FIG. 18, the mother chip 102 contains bump connections 110 which will centrally couple to a package 106 and contains bumps 108 which peripherally connect to one or more daughter integrated circuits 104. The underfill materials 404 and 408 are also illustrated in FIG. 18. Therefore, FIG. 18 illustrates an alternate configuration than that illustrated in FIG. 5. Even other variations exists.

FIGS. 19–22 illustrate various computer architectures which can be formed using the flip chip package taught herein in FIGS. 5–18. These computer architectures are multi-chip architectures having high speed multi-level memory hierarchy (e.g., two or more cache levels such as L1, L2, L3 . . . LN cache levels). Since a central processing unit (CPU) and a memory system can be coupled together via the bump connections 108 of FIG. 5, reduced capacitance and inductance is achieved via this interconnection scheme. Since the memory hierarchy and the central processing unit can be placed in closer proximity due to the packages discussed in FIGS. 5–18, smaller output drivers can be utilized to perform electrical signal transmissions across the bumps 108 whereby less power is consumed by a computer architecture. In addition, current L2 cache interfaces are increasingly difficult to design as frequency requirements increase primarily due to loading created by the component interconnects. Using the interconnect scheme taught herein in FIG. 5, an L2 cache (a second level of cache) formed on a daughter IC 104 can communicate with a CPU core formed on another IC 102 at much higher frequencies due to the greatly reduced interconnect loading. For example, it is feasible that an L2 cache interface made in accordance with FIGS. 5–18 could operate at 400 MHz, or 600 MHz, or higher, whereby current technology is limited at roughly 300 MHz.

In addition, current cost-effective microprocessor architectures are data bandwidth limited due to economic restrictions or pin count and frequency limitations of the prior art. Due to this limited ability to interconnect the L2 cache with the core when the two ICs are separately packaged devices, information will not be provided at desired speeds from the L2 cache to the core in these systems. In addition, since the connections between the L2 cache and the microprocessor are pin limited, most data connections between the microprocessor and the L2 cache are bi-directional whereby optimal pipelining to the L2 cache can no longer be achieved. The architectures taught in FIGS. 19–22 enable higher frequencies of operation between cache systems and CPU cores, higher signal or I/O pins between cache systems and CPU cores, lower power consumption, one clock cycle cache line updates, and also enable architectures previously not available due to limitations in IC package design.

Figure 19:
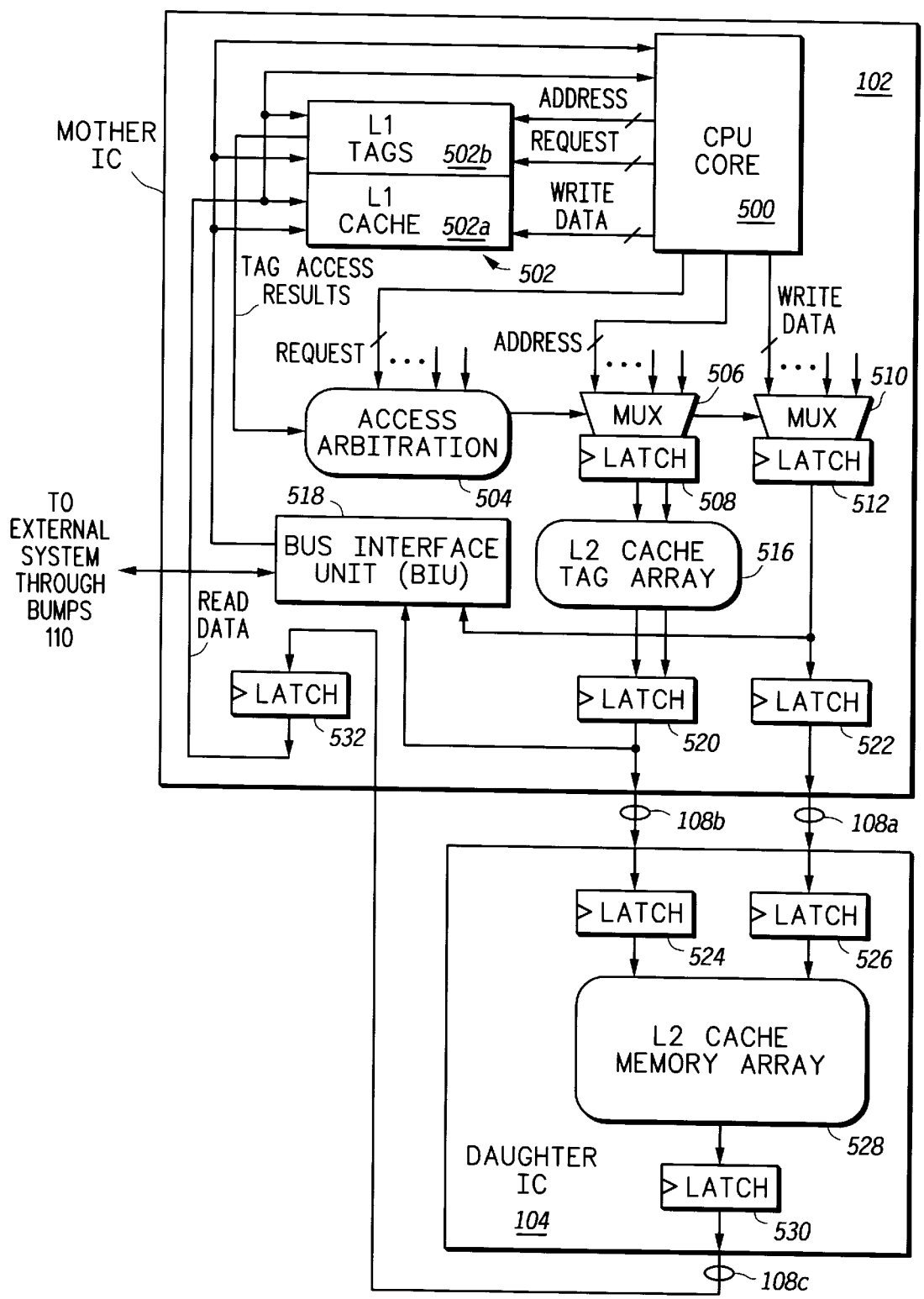
FIGS. 19–22 illustrate, in block diagrams, computer architectures which be formed using the packaging technology shown in FIGS. 5–18 in accordance with the present invention.

FIG. 19 illustrates a computer architecture system having an L2 cache with a single unidirectional read port and a single unidirectional write port. The read and write ports are segmented from one another which would increase pin count in conventional designs beyond permissible levels. Due to the fact that the read and write ports are unidirectional and are segmented from one another in FIG. 19, optimal pipelining can be achieved through accesses to the L2 cache which is not possible in conventional technology. The structure of FIG. 19 contains a unified L1 cache which contains both instruction and data information.

FIG. 19 specifically illustrates a mother chip 102 and a daughter chip 104. It is important to note that the mother chip is typically the larger footprint chip and the daughter chip is typically the smaller footprint chip. In some designs, the CPU is larger than the L2 cache memory IC. Yet, in other designs, the CPU is smaller than the L2 cache memory IC. For this reason, the mother and daughter chips of FIG. 19 may be reversed for other architectures.

The mother chip 102 and the daughter chip 104 are packaged together as previously illustrated in FIGS. 5–18. The mother chip 102 of FIG. 19 contains four primary circuit structures illustrated as the central processing unit (CPU) core 500, the L1 cache 502 (a first level of cache), the L2 cache tag array 516 for a second level (L2) of cache, and the bus interface unit (BIU) 518. In the mother chip 102, the CPU core 500 executes instructions and performs computations within the computer system. In order to perform these functions, the core 500 needs access to various executable computer instructions and data operands. To obtain these instructions and data operands, the core issues requests and address values to the L1 cache 502. In addition to providing the request information and the address, if a write is performed, the core 500 will provide write data as illustrated in FIG. 19. In the alternative, if a read operation is being performed, the core 500 will simply provide the request information and the address and then be presented with read data as input as illustrated in FIG. 19. Once the L1 cache 502 receives an address and a request from the CPU core 500, both the L1 tags 502b and the cache storage array 502a are simultaneously accessed to determine if a hit or miss will occur in the L1 cache 502. If a hit occurs, the data requested is present within the L1 cache and the core will obtain this information in order to perform useful operations. If a miss occurs in the L1 cache 502, then the core 500 advances the CPU's request control signals and address information to the access arbitration circuitry 504 and the multiplexer (MUX) 506 and latch 508.

The access arbitration circuitry 504 may receive multiple requests in the same clock cycle. This case, the access arbitration circuitry 504 will perform a prioritization operation to determine which system accesses are to be performed before other system accesses. In a single core system for example, the circuitry 504 may determine which operation takes precedence among a cache snoop operation, a cache tag update, cache reload operations, a core cache access (e.g., read or write operation), or other cache operations. In a multiple core system, the access arbitration circuitry 504 will also need to prioritize the various accesses between the multiple cores within the mother chip 102.

As previously stated, the address information output from the core 500 is provided to a multiplexer 506 as illustrated in FIG. 19 if a miss occurs in the L1 cache 502. The multiplexer 506 can multiplex between different address sources to enable the specific operation selected by the arbitration circuitry 504. In addition, the multiplexer 506 specifically illustrates multiple core inputs via the label ". . ." to allow for multiple cores to be integrated into the mother chip 102 to enable multiprocessing systems. After the multiplexer 506 selects which address to provid as output, a latch 508 will latch this address value for subsequent use.

When performing a write operation, the write data is provided as an output from the core 500. This write data is provided to a multiplexer 510 which is similar to the multiplexer 506. The multiplexer 510 determines which data values are to be provided as output wherein these data values are latched in a latch 512 for subsequent use.

If the L1 cache experiences a miss, the L2 cache tag array 516 is provided with the address stored within the latch 508. For both the read and the write operation, the L2 cache tag array 516 is accessed to determine whether the desired location can be found within the L2 cache 528 or must be found in the external system (e.g., external DRAM memory or an external peripheral device). If the circuitry 516 determines that the requested location resides within the L2 cache, a hit occurs, and the cache read or write access will complete within the daughter chip 104 without need for external system access. The read operation completes by providing the read data to the latch 530 for access by the CPU core 500 via the bump connections 108c. The write completes by writing the specified data into the L2 cache storage array 528. However, if a miss is detected within the L2 tag circuitry 516, the system access is forwarded to the bus interface unit (BIU) 518 so that the read or write access will be competed by the external system coupled to the ball grid array 110.

In summary, if a miss is detected in the L2 tag array 516, the bus interface unit (BIU) 518 will access the external system through the bumps 110 illustrated in FIG. 5. However, if a hit is determined in the L2 tag circuitry 516 of FIG. 19, the read or write access is communicated through the bumps 108 of FIG. 5 to the daughter chip 104 illustrated in FIG. 18 where the operation will complete in the daughter chip 104.

FIG. 19 generally illustrates three different groups of conductive bump connections 108 between the daughter chip 104 and the mother chip 102 labeled as bumps 108a, 108b, and 108c. FIG. 19 specifically illustrates bump connections 108a which allow write data to be communicated from the core 500 to the daughter chip 104. Connections 108b in FIG. 19 are used to communicate request and address information between the mother chip 102 and the daughter chip 104. The bump connections 108c in FIG. 19 are used to communicate read data from the L2 cache within the daughter chip 104 back to the CPU core 500 within the mother chip 102. For each of the interconnections 108a, 108b, and 108c, two latches are provided where one is located in the mother IC 102 and the other is located in the daughter IC 104. For example, mother chip 102 contains a latch 522 and the daughter chip contains a latch 526 where the bump connections 108a lie between the latch 522 and the latch 526. FIG. 19 illustrates a latch 520, within the mother chip 102, and a latch 524, within the daughter chip 104. The bump connections 108b lie between the latch 520 and the latch 524. FIG. 19 illustrates a latch 530 located within the daughter chip 104 and a latch 532 located within the mother chip 102 where the bump interconnections 108c are located between the latches 530 and 532.

Figure 20:
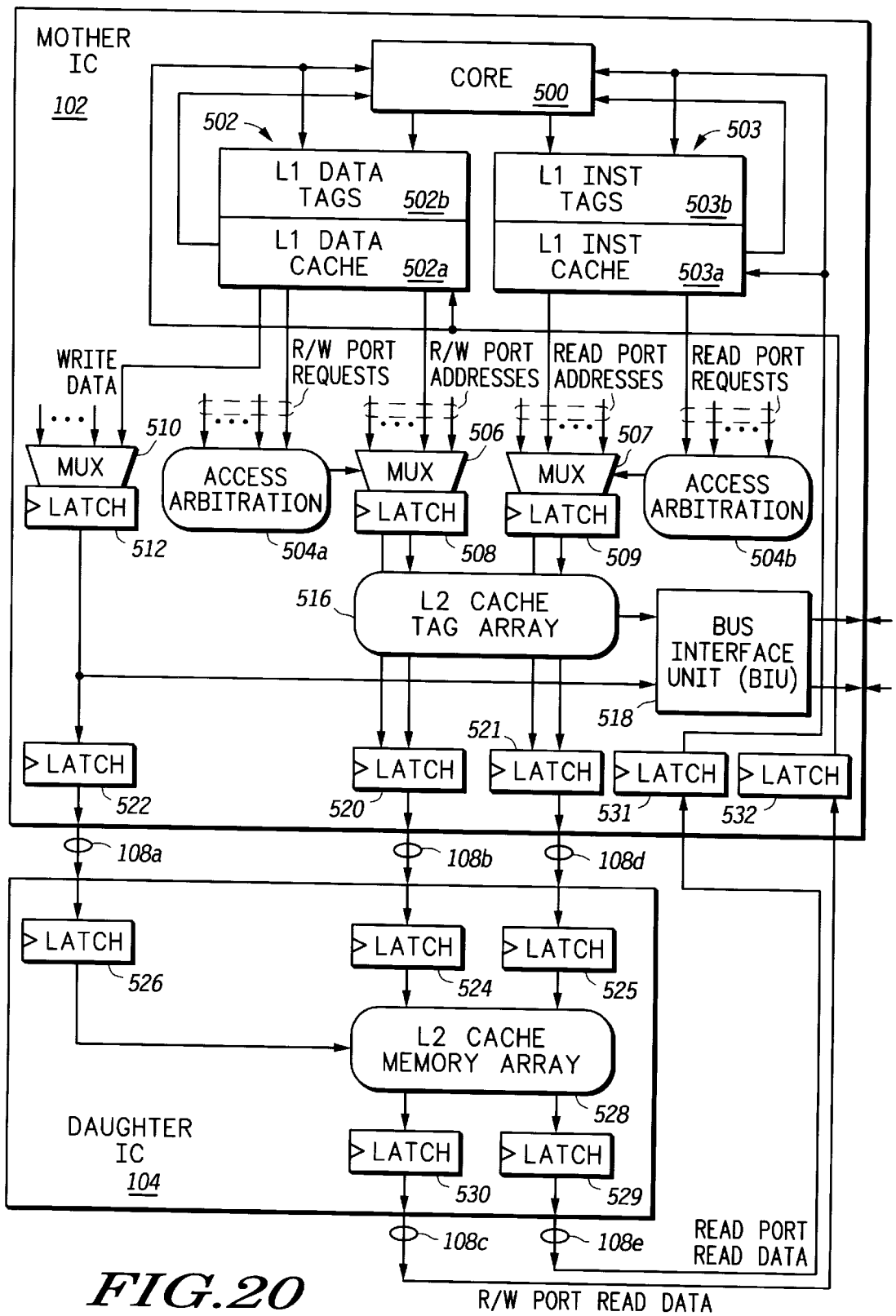
Figure 21:
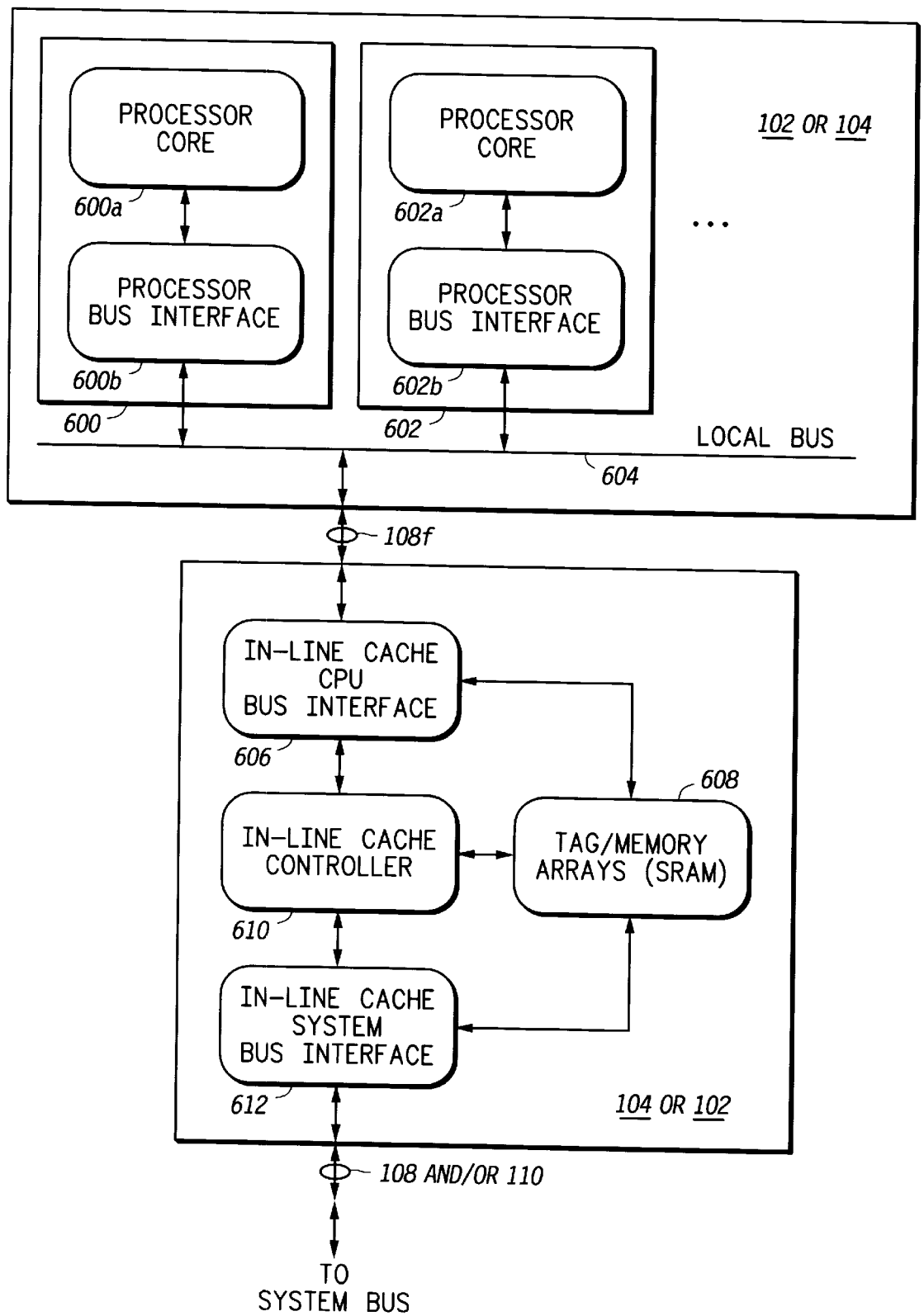
Figure 22:
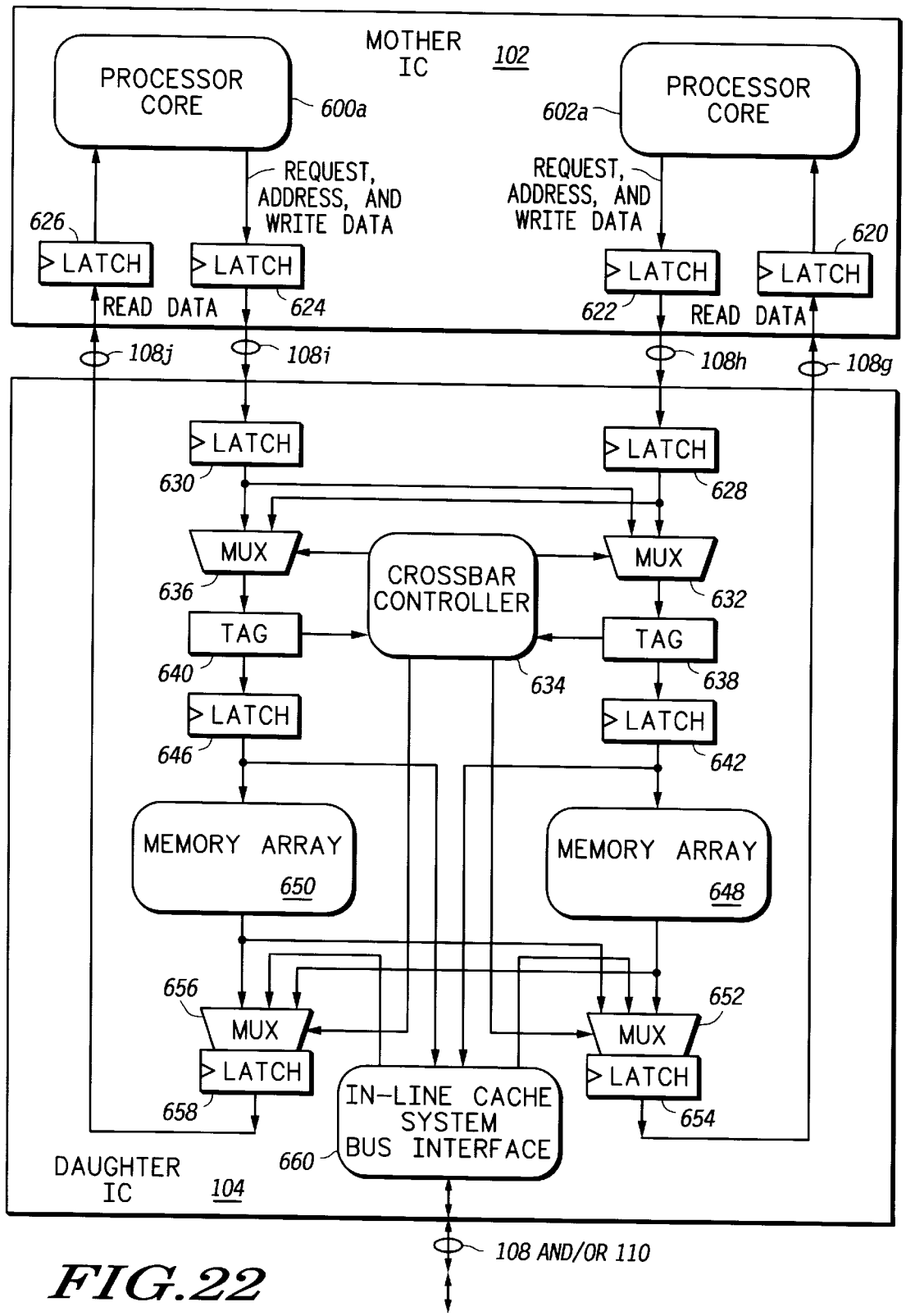

Latches 520, 522, 524, 526, 530, and 532, as well as other chip interface latches in FIGS. 20–22, are present to allow the frequency of operation of the computer architecture to be maximized. Generally, the conductive bump connections 108 in FIG. 5, which are analogous to the bump connections 108a–108c in FIG. 19, are typically frequency-limiting connections within a synchronous system. Therefore the chip interface latches 520 through 532 in FIG. 19 ensure that the speed critical paths created by the interconnections 108a through 108c in FIG. 19 can be operated at a higher frequency.

When using the design of FIG. 19, the interconnections 108a–108c are not signal limited to the extent the prior art is pin limited. Therefore, the interface between the core 500 and the L2 cache 528 may be a 64 bit data path by using roughly 200 bumps 108a–108c. A 128 bit data path may be implemented in FIG. 19 between the core 500 and the cache 528 by using roughly 325 bumps 108a–108c. Furthermore, a 256 bit data path which enables one line of a cache to be read or written in a single clock cycle can be implemented with roughly 600 bump connections 108a–108c in FIG. 19.

It is important to note that FIG. 19 specifically describes a system that first accesses L1, then accesses L2, then accesses external memory depending upon the occurrence of hits and misses at each time serial stage. However, the device of FIG. 19 could easily be designed so that two or more levels of memory (i.e., L1 and L2, L2 and external memory, or all of L1, L2, and external memory) are accessed in parallel wherein the accesses that do not hit are canceled once a valid hit in one location occurs.

FIG. 19 illustrates a computer system having a unified L1 cache which can improve the performance of an integrated circuit by using segmented unidirectional read and write busses. FIG. 20 illustrates an architecture similar to FIG. 19 except that the L1 cache in FIG. 20 is not unified. Instead, the L1 cache in FIG. 20 has a separate instruction cache (I-cache) 503 and a separate data cache (D-cache) 502. The L1 I-cache 503 is used to store instructions for use by the core 500, and the L1 D-cache 502 is used to store data operands for access by the core 500.

Due to the presence of the separate data cache and the separate instruction cache, the computer architecture of FIG. 20 has more interchip I/O than the computer architecture illustrated in FIG. 19. Due to this added I/O, the architecture of FIG. 20 is much harder to implement using current packaging technology, but the packaging technology of FIGS. 5–18 makes this architecture feasible. Therefore, FIG. 20 offers a more complex design while also offering improved performance over the design of FIG. 19.

All elements in FIG. 20 which are analogous or identical to elements in FIG. 19 have identical numerical labels in FIGS. 19 and 20. These analogous or identical elements are not further described hereinbelow. The computer system of FIG. 20 contains some additional elements which cannot be found in FIG. 19. These additional elements include the instruction cache 503, the multiplexer 507, the latch 509, the latch 521, the latch 525, the latch 529, and the latch 531. In addition, additional conductive bump interconnections 108d and 108e are added to the previously discussed interconnections 108a through 108c in FIG. 19 thereby increasing the interchip I/O. The added I/O overhead offers improved performance since an instruction read (I-read) can be performed simultaneously with a data read or write operation (D-read or D-write).

The architecture of FIG. 20 can be easily manufactured using the structure of FIG. 5 since 300 to 500 bump interconnections 108 can be formed into an appropriate array using current bump processing. However, if the L2 cache of FIG. 20 and the microprocessor of FIG. 20 were separately packaged integrated circuits, the pin limitations of these packages would not enable the architecture illustrated in FIG. 20.

FIG. 21 illustrates a low cost multiprocessing computer architecture. Specifically, FIG. 21 illustrates a first integrated circuit which contains a plurality of processor cores 600 and 602 and another integrated circuit which contains an in-line cache controller. Depending upon the size of the respective two integrated circuits illustrated in FIG. 21, the integrated circuit containing the processors may be the mother chip and the in-line cache controller chip may be the daughter chip or vice versa. The processor integrated circuit of FIG. 21 contains a plurality of individual microprocessors 600 and 602 which are typically identical microprocessors but may be different processors, like a reduced instruction set computer (RISC) processor combined with a digital signal processor (DSP). Each microprocessor 600 and 602 contains a processor core 600a and 602a and a processor bus interface 600b and 602b, respectively. It should be noted that the processor cores 600a and 602a may contain at least one level of cache, such as a first level L1 cache. The bus interface units 600b and 602b interface to a local high speed bus 604. The bus 604 will interface between the integrated circuits 102 and 104 using the bump connections 108 of FIG. 5 which are illustrated as bump connections 108f in FIG. 21.

The in-line cache integrated circuit of FIG. 21 contains an in-line cache CPU bus interface unit 606 which is used to communicate or receive information over the local bus 604 via the bumps 108f. When a microprocessor 600 or 602 makes a request for instructions and/or data, the in-line cache controller 610 accesses the tag portion of tag/memory arrays 608 to determine if the requested information is present. If the requested information is present, then the information is provided from the tag/memory arrays 608 to the local bus 604 for use by one or more of the microprocessor cores 600 and 602. If the information is not found, then the integrated circuit 104 uses a in-line cache system bus interface unit 612 to forward the core's request to an external system bus. The interface between the bus interface unit 612 and the external system is performed using one or more of the bump connections 108, 110, or 112 shown in FIG. 5.

FIG. 22 illustrates an architecture that is similar to that illustrated in FIG. 21, except that the local bus 604 of FIG. 21 is eliminated. Since the system of FIG. 22 eliminates the local bus, greater performance improvements can be realized since the local bus of FIG. 21 is typically a throughput and latency bottleneck within system architectures. FIG. 22 illustrates a mother chip 102 that contains processor cores 600a and 602a as previously illustrated in FIG. 21. Instead of using a bus interface unit (BIU) and a local bus as in FIG. 21, the processors of FIG. 22 communicate with the L2 cache directly through latches 620 through 626 without need to implement a bus protocol. The latches 622 and 624 will store system access request information, addresses and outgoing write data, whereas the latches 620 and 626 will store read data which is being provided to the processors 600a and 602a.

The latches 620 through 626 provide system access information through the bump connections 108g, 108h, 108i, and 108j as illustrated in FIG. 22 and previously discussed with respect to bumps 108 in FIG. 5. FIG. 22 illustrates the daughter chip 104 which contains chip interface latches 628 and 630. The latches 628 and 630 will capture request, address, and write data information provided from the microprocessor cores located in the mother chip 102. The multiplexers 632 and 636 allow either core 600a or 602a to access either of the tag arrays 638 or 640. Switching between the two cache arrays in the daughter chip 104 is controlled by the crossbar controller 634 or a like switching circuit. If a hit is determined within one or both of the tags 638 and 640, then the value stored in the latch 642 and/or the latch 646 which corresponds with the tag array is used to reference a storage location within the selected cache memory array 648 and/or 650. The cache memory array experiencing the hit will either perform the requested write operation, or provide requested read data as output to multiplexers 652 and 656. The multiplexers 652 and 656 properly route read data from the cache arrays 648 and 650 to the proper requesting processor core 600a or 602a. The latches 654 and 658 are used for the performance reasons previously discussed with respect to FIG. 19.

If the requested access by either core 600a or 602a results in a miss in the tag arrays 638 and 640, then the in-line cache system bus interface unit (BIU) 660 is used to access external memory using the bump connections 108 and/or 110. Typically, the manufacturing costs of the architecture in FIG. 22 is prohibitive for the intended market using segmented and separately-packaged integrated circuits (ICs) due to the high pin count on these ICs. The package of FIG. 22 can economically accommodate 500 to 600 signal pins whereas current packaging technology is not able to economically accommodate 500 to 600 pins to the same extent.

Although the invention has been described and illustrated with reference to specific embodiments, it is not intended that the invention be limited to those illustrative embodiments. Those skilled in the art will recognize that modifications and variations may be made without departing from the spirit and scope of the invention. While ball bumps are taught herein, pin grid array (PGA), pogo pin connections, dual inline packages (DIP), tape automated bonding (TAB) contacts, and other packaging technology may be used herewith. Also, the daughter chip(s) taught herein may be passive elements or other discrete elements such as capacitors, diodes, resistors, inductors, filters, power MOSFET, etc.. In addition, the package 106 may be manufactured to contain embedded passive or active devices. Furthermore, the package taught herein can enable a device having a plurality of CPU cores that communicate to their own L1 cache at higher frequencies of operation. Therefore, it is intended that this invention encompass all of the variations and modifications as fall within the scope of the appended claims.

What is claimed is:

1. A semiconductor structure comprising:
  a first integrated circuit having bump contacts, the bump contacts being electrically coupled to an active surface of the first integrated circuit;
  a second integrated circuit having a first set of bump contacts and a second set of bump contacts different from the first set of bump contacts;

a package having bump contacts on a first surface of the package; wherein
a first set of conductive bumps that contacts the bump contacts of the first integrated circuit to the first set of bump contacts of the second integrated circuit; and
a second set of conductive bumps that contacts the second set of bump contacts of the second integrated circuit to the bump contacts of the package.

2. The semiconductor structure of claim 1 wherein underfill material lies between the first and second integrated circuits.

3. The semiconductor structure of claim 1 wherein underfill material lies between the first integrated circuit and the package.

4. The semiconductor structure of claim 1 wherein underfill material lies between the second integrated circuit and the package.

5. The semiconductor structure of claim 1 wherein a ball grid array (BGA) region is located on a package surface opposite a package surface used to coupled to one of the second integrated circuit.

6. The semiconductor structure of claim 1 wherein the first integrated circuit is part of a plurality of integrated circuits which are coupled to the second integrated circuit by the first set of conductive bumps.

7. The semiconductor structure of claim 1 wherein a cavity is formed in the package to receive the first integrated circuit.

8. The semiconductor structure of claim 1 wherein a cavity is formed entirely through the package to expose a portion of the first integrated circuit for improved thermal dissipation.

9. The semiconductor structure of claim 8 wherein the cavity is filled with a heat sink material.

10. A structure comprising:
a first surface wherein a first portion of the first surface contains bump contact regions and wherein a second portion of the first surface contains at least one cavity adjacent the bump contact regions;
a second surface opposite the first surface wherein the second surface contains a plurality of package ball bumps; and
a plurality of interconnect layers and conductive vias within the structure for electrically coupling the bump contact regions on the first surface to the plurality of package ball bumps on the second surface, wherein the plurality of interconnect layers includes:
at least three conductive stacked layers between the first and second surface wherein a first of the at least three conductive stacked layers is adapted to route signals from the first surface to the second surface, a second of the at least three conductive stacked layers is adapted to route ground voltages between the first and second surfaces, and a third of the at least three conductive stacked layers is adapted to route at least one power supply voltage between the first and second surfaces.

11. The structure of claim 10 wherein the second portion of the structure is centrally located within the first portion of the structure which contains the bump contact regions.

12. The structure of claim 10 wherein the second portion of the structure is centrally located and is adapted to receive an integrated circuit geometry.

13. The structure of claim 10 wherein the at least one cavity extends through the entire structure whereby the at least one cavity is adapted to provide thermal dissipation to an adjacent integrated circuit.

14. The structure of claim 10 wherein the at least one cavity is adapted to be filled with a heat sink material.

15. A semiconductor structure comprising:
a substrate;
active circuitry formed on the substrate;
a first plurality of bump bond regions;
a second plurality of bump bond regions;
a plurality of conductive interconnect members for routing the active circuitry to the first and second plurality of bump bond regions; and
wherein the first plurality of bump bond regions are adapted to be coupled to an integrated circuit and wherein the second plurality of bump bond regions are adapted to be coupled to a BGA package.

16. A semiconductor structure comprising:
a mother chip having a first bump bond region centrally located within a second bump bond region which is peripherally located adjacent a periphery the mother chip;
a daughter chip bump-bonded to the first bump bond region of the mother chip whereby the daughter chip is centrally located;
underfill material located between the daughter chip and the mother chip; and
a package structure having a first surface bump-bonded to the second bump bond region of the mother chip wherein the daughter chip lies within a centrally-located recess formed within the first surface of the package structure, the package structure having a second surface opposite the first surface which contains external terminals of the semiconductor structure wherein a plurality of metallic layers and conductive vias within the package structure electrically connect the mother chip to the external terminals of the package structure.

* * * * *